United States Patent
Kang

(10) Patent No.: US 7,229,849 B2
(45) Date of Patent: Jun. 12, 2007

(54) METHOD FOR PACKAGING A SEMICONDUCTOR DEVICE

(75) Inventor: Byoung Young Kang, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/751,212

(22) Filed: Dec. 30, 2003

(65) Prior Publication Data
US 2004/0157371 A1    Aug. 12, 2004

(30) Foreign Application Priority Data
Dec. 30, 2002    (KR)    ....................... 10-2002-0086652

(51) Int. Cl.
*H01L 21/00*    (2006.01)
(52) U.S. Cl. ....................................................... 438/108
(58) Field of Classification Search ........ 257/734–738, 257/778–786, E21.503; 438/108–111
See application file for complete search history.

(56) References Cited

U.S. PATENT DOCUMENTS

| 6,232,652 | B1 * | 5/2001 | Matsushima | ................. | 257/667 |
| 2002/0084521 | A1 * | 7/2002 | Coyle et al. | ................. | 257/690 |
| 2002/0171157 | A1 * | 11/2002 | Soga et al. | ................. | 257/783 |
| 2003/0011078 | A1 * | 1/2003 | Fukao et al. | ................. | 257/787 |
| 2004/0104473 | A1 * | 6/2004 | Farnworth | ................. | 257/734 |
| 2004/0155357 | A1 * | 8/2004 | Ho et al. | ................. | 257/778 |
| 2005/0074971 | A1 * | 4/2005 | Ikumo et al. | ................. | 438/689 |
| 2005/0250303 | A1 * | 11/2005 | Hsieh et al. | ................. | 438/612 |

FOREIGN PATENT DOCUMENTS

JP    8-172114    7/1996
JP    2001-332663    11/2001

OTHER PUBLICATIONS

Byoung Young Kang, "Ceramic Packaging Method Employing Flip-Chip Bonding", U.S. Appl. No. 10/751,209, filed on Dec. 30, 2003.
Kenji Katsuki, Takao Shioyama, Shinji Yoshinaka and Atsuo Sasaki; Binder for Mounting Flip Chip and Manufacturing Method for Semiconductor Device Using the Same; Patent Abstracts of Japan; Publication No. 2001-332683; Publication Date: Nov. 30, 2001.
Takashi Tanaka; Board Correction Method; Patent Abstracts of Japan; Publication No. 08-172114; Publication Date: Jul. 2, 1996.

* cited by examiner

*Primary Examiner*—Nathan W. Ha
(74) *Attorney, Agent, or Firm*—Andrew D. Fortney

(57) ABSTRACT

A method for packaging a semiconductor device wherein a chip is interconnected with a substrate by performing a flip-chip bonding by using an Au bump formed on a bond pad of the chip. In the method, a wire-bonding process and a molding process using an epoxy molding compound are not required. Further, a process of attaching solder balls to the substrate is not required, which eliminates subsequent flux printing and deflux processes. Accordingly, a packaging process of the semiconductor device becomes simplified and therefore the cost of the semiconductor device is decreased.

20 Claims, 2 Drawing Sheets

METHOD FOR PACKAGING A SEMICONDUCTOR DEVICE

FIELD OF THE INVENTION

The present invention relates to a method for packaging a semiconductor device; and, more particularly, to a method for interconnecting a chip with a substrate in a semiconductor device by performing a flip-chip bonding by forming an Au bump on a bond pad of the chip, thereby enabling a miniaturization of the semiconductor device and a simplification of the packaging process.

BACKGROUND OF THE INVENTION

FIG. 1 illustrates a sectional view of a BGA package fabricated in accordance with a packaging method of the prior art. As shown in FIG. 1, in accordance with the prior art, a chip 106 is attached to a substrate 100 through an adhesive 102. Thereafter, the chip 106 is interconnected with the substrate 100 through a gold wire 104. Then, the chip 106 and the gold wire 104 are encapsulated and sealed by using an epoxy molding compound 108. Solder balls 110 are then attached to the substrate 100. Subsequently, the substrate is sawed to singulate individual packages, by which a fabrication of the BGA package is completed.

In the BGA package as shown in FIG. 1, a flip-chip bonding is performed by attaching solder balls to a bond pad of the substrate, which requires subsequent a flux printing process and a deflux process. Therefore, the fabrication process of the BGA package becomes complicated and it is hard to miniaturize the package.

SUMMARY OF THE INVENTION

It is, therefore, an object of the present invention to provide a method for packaging a semiconductor device wherein a chip and a substrate is interconnected by performing a flip-chip bonding through an Au bump formed on a bond pad of the chip, thereby enabling a miniaturization of the device and a simplification of the packaging process.

In accordance with a preferred embodiment of the present invention, there is provided a method for packaging a semiconductor device, including the steps of: (a) forming an Au bump on a bond pad of a wafer; (b) dicing the wafer into a chip; (c) attaching the chip to a substrate to form a flip-chip bonding therebetween by using a thermo-pressure process; (d) encapsulating the flip-chip bonding by using a nonconductive epoxy; and (e) sawing the substrate to singulate individual packages.

BRIEF DESCRIPTION OF THE DRAWINGS

The above and other object and features of the present invention will become apparent from the following description of preferred embodiments given in conjunction with the accompanying drawings, in which.

DETAILED DESCRIPTION OF THE PREFERRED EMBODIMENT

Figure 1:
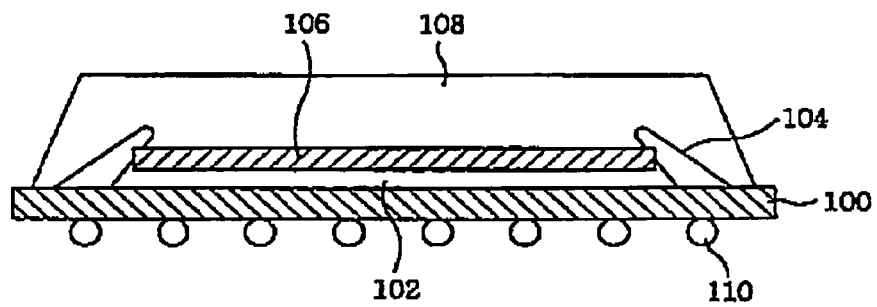
FIG. 1 describes a sectional view of a BGA package fabricated by using a method in accordance with the prior art.
Figure 2:
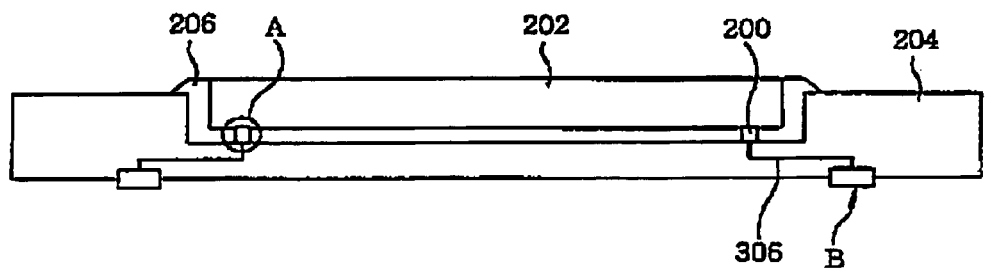
FIG. 2 depicts a sectional view of a BGA package fabricated by using a method in accordance with a preferred embodiment of the present invention.

FIG. 2 illustrates a sectional view of a BGA package fabricated by using a method in accordance with a preferred embodiment of the present invention. In the following, the method of the present invention will be described in detail with reference to FIG. 2.

As shown in FIG. 2, an Au bump 200 is deposited on a bond pad (see bond pad 208 in FIG. 3A) formed on a wafer. The wafer is then diced into a chip 202, which is attached to a substrate 204 by using a thermo-pressure process. An electrical connection of the chip 202 to an external deviec, i.e., a flip-chip bonding is completed through the thermo-pressure process.

Figure 3A:
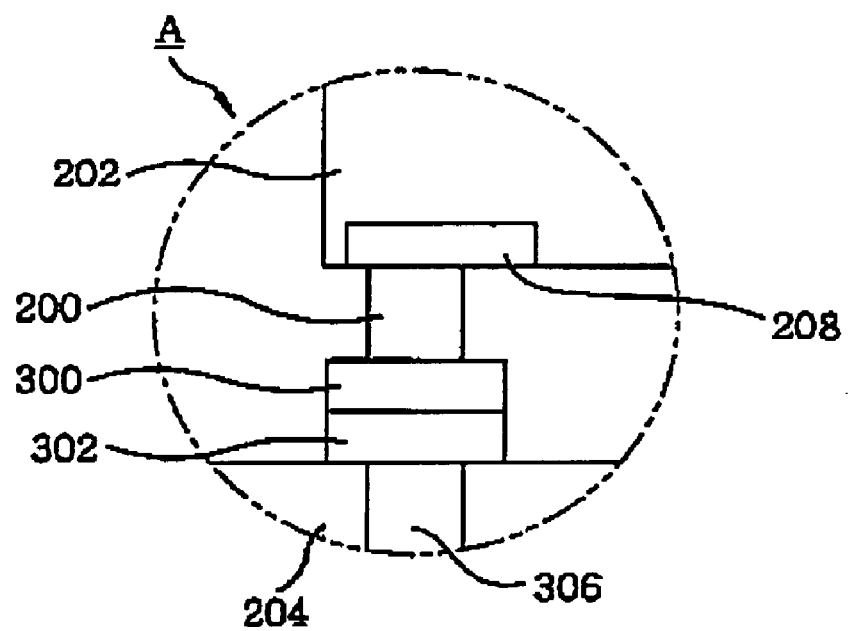
FIG. 3A illustrates an enlarged sectional view of an Au bump formed on a bond pad of the chip shown in FIG. 2.

As shown in FIG. 3A, the Au bump 200 formed on bond pad 208 on the chip 202 may be attached to Cu pattern 306 on the substrate 204 through an Ag layer 300 and a Cu layer 302.

Figure 3B:
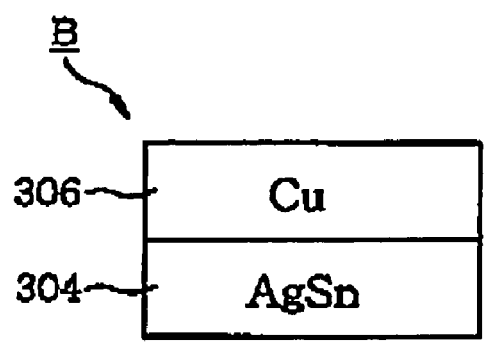
FIG. 3B provides an enlarged sectional view of a plating lead formed in the substrate shown in FIG. 2.

Meanwhile, a plating lead B positioned on a lower part of the substrate 204 is connected to the Au bump 200 through a Cu pattern 306. As shown in FIG. 3B, the plating lead B is formed by plating an AgSn layer on the Cu pattern 306.

Thereafter, the flip-chip bonding is encapsulated by using a nonconductive epoxy and then the substrate 204 is sawed to singulate individual packages.

As described above, in accordance with present invention, a wire-bonding process and a molding process using an epoxy molding compound are not required. Further, a process of attaching solder balls to the substrate is not required, which eliminates subsequent flux printing and deflux processes. Accordingly, a packaging process of a semiconductor device becomes simplified and therefore the cost of the semiconductor device is decreased.

While the invention has been shown and described with respect to the preferred embodiments, it will be understood by those skilled in the art that various changes and modifications may be made without departing from the spirit and scope of the invention as defined in the following claims.

What is claimed is:

1. A method for packaging a semiconductor device, comprising the steps of:
   (a) forming an Au bump on a bond pad of a wafer;
   (b) dicing the wafer into a chip; and
   (c) attaching the Au bump of the chip to a copper pattern embedded in a substrate to form a flip-chip bond using a thermo-pressure process, wherein the Au bump is connected directly to the bond pad of the chip and connected to the substrate through an Ag layer and a Cu layer, and has a pillar shape.

2. The method of claim 1, further comprising the step of
   (d) encapsulating the flip-chip bond using a nonconductive epoxy after step (c).

3. The method of claim 2, further comprising the step of
   (e) sawing the substrate to singulate individual packages.

4. The method of claim 1, wherein the thermo-pressure process comprises attaching the Au bump to a copper pattern in the substrate.

5. The method of claim 4, further comprising forming a plating lead on an opposite side of the substrate from the chip.

6. The method of claim 5, wherein forming the plating lead comprises plating an AgSn layer on the copper pattern.

7. The method of claim 1, wherein the Ag layer directly contacts the Au bump.

8. The method of claim 1, wherein the Cu layer directly contacts the substrate.

9. The method of claim 1, wherein the substrate has a trench, and the Au bump of the chip is attached to the copper pattern in the trench.

10. The method of claim 1, wherein the Ag layer contacts the Au bump and the Cu layer, and the Cu layer contacts the copper pattern.

11. A method for packaging a semiconductor device, comprising the steps of:
(a) forming a pillar-shaped Au bump directly on a bond pad of a wafer;
(b) dicing the wafer into a chip; and
(c) attaching the pillar-shaped Au bump of the chip to a copper pattern embedded in a substrate through a plurality of metal layers comprising an Ag layer and a Cu layer to form a flip-chip bond using a thermo-pressure process.

12. The method of claim 11, further comprising the step of
(d) encapsulating the flip-chip bond using a nonconductive epoxy after step (c).

13. The method of claim 12, further comprising the step of
(c) sawing the substrate to singulate individual packages.

14. The method of claim 11, wherein the thermo-pressure process comprises attaching the Au bump to a copper pattern in the substrate.

15. The method of claim 14, further comprising forming a plating lead on an opposite side of the substrate from the chip.

16. The method of claim 15, wherein forming the plating lead comprises plating an AgSn layer on the copper pattern.

17. The method of claim 11, wherein the Ag layer directly contacts the Au bump.

18. The method of claim 11, wherein the Cu layer directly contacts the substrate.

19. The method of claim 11, wherein the substrate has a trench, and the Au bump of the chip is attached to the copper pattern in the trench.

20. The method of claim 11, wherein the Ag layer contacts the Au bump and the Cu layer, and the Cu layer contacts the copper pattern.

* * * * *